US009103018B2

United States Patent
Madocks et al.

(10) Patent No.: US 9,103,018 B2
(45) Date of Patent: Aug. 11, 2015

(54) SPUTTERING TARGET TEMPERATURE CONTROL UTILIZING LAYERS HAVING PREDETERMINED EMISSIVITY COEFFICIENTS

(75) Inventors: John Madocks, Tucson, AZ (US); Mark A. George, Tucson, AZ (US)

(73) Assignee: GENERAL PLASMA, INC., Tucson, AZ (US)

(*) Notice: Subject to any disclaimer, the term of this patent is extended or adjusted under 35 U.S.C. 154(b) by 562 days.

(21) Appl. No.: 12/776,706

(22) Filed: May 10, 2010

(65) Prior Publication Data

US 2011/0005919 A1 Jan. 13, 2011

Related U.S. Application Data

(60) Provisional application No. 61/215,759, filed on May 8, 2009.

(51) Int. Cl.
*H01J 37/34* (2006.01)
*C23C 14/08* (2006.01)
*C23C 14/34* (2006.01)

(52) U.S. Cl.
CPC ............ *C23C 14/085* (2013.01); *C23C 14/3407* (2013.01); *H01J 37/3408* (2013.01); *H01J 37/3426* (2013.01); *H01J 37/3435* (2013.01); *H01J 37/3497* (2013.01)

(58) Field of Classification Search
USPC ........................................... 156/283; 228/194
See application file for complete search history.

(56) References Cited

U.S. PATENT DOCUMENTS

| 4,029,828 | A * | 6/1977 | Bildstein et al. ............... 378/143 |
| 6,039,850 | A * | 3/2000 | Schulz ...................... 204/192.15 |
| 6,619,537 | B1 * | 9/2003 | Zhang et al. ................... 228/194 |
| 6,743,343 | B2 * | 6/2004 | Kida et al. ................ 204/298.13 |
| 2007/0295596 | A1 * | 12/2007 | Inagawa et al. ............. 204/192.1 |
| 2008/0236738 | A1 * | 10/2008 | Lo et al. ......................... 156/283 |

OTHER PUBLICATIONS

Pawlowski, Lech, "The Science and Engineering of Thermal Spray Coatings", Mar. 20, 2008, Wiley, Second Edition, pp. 483.*

* cited by examiner

*Primary Examiner* — Keith Hendricks
*Assistant Examiner* — Timon Wanga
(74) *Attorney, Agent, or Firm* — Perkins Coie LLP

(57) ABSTRACT

A sputter coating apparatus for sputter coating a substrate in a processing chamber includes a target of sputter coating material supported within the processing chamber. The target has a sputtering surface and a back surface. The target is affixed to a backing plate such that the back surface of the target is disposed adjacent to a first surface of the backing plate. The backing plate is in fluid communication with a source of cooling fluid. The target back surface has a first layer selected to have a high thermal emissivity coefficient. The backing plate first surface carries a second layer having a high emissivity coefficient. The target back surface first layer and the backing plate first surface second layer provide enhanced heat transfer between the target and the backing plate via thermal radiation.

6 Claims, 5 Drawing Sheets

SPUTTERING TARGET TEMPERATURE CONTROL UTILIZING LAYERS HAVING PREDETERMINED EMISSIVITY COEFFICIENTS

CROSS-REFERENCE TO RELATED APPLICATION

This application claims priority of U.S. Provisional Patent Application Ser. No. 61/215,759 filed May 8, 2009, which is incorporated herein by reference.

FIELD OF THE INVENTION

The present invention relates in general to sputtering apparatus and methodology, and in particular to heat dissipation for a target in a sputtering apparatus.

BACKGROUND OF THE INVENTION

In a sputtering process, substrates that are to be sputter coated with a thin deposited film are positioned within a processing chamber adjacent to a sputtering target that is the source of the deposition material. The processing chamber is evacuated to provide a vacuum and the target has a negative voltage applied thereto. A plasma discharge is produced which creates positive ions that bombard the target separating atoms from the surface of the target. The atoms of target material travel to the substrate surface forming a coating of target material.

Targets are typically supported on a backing plate such that the back face of the target is against a corresponding surface of the backing plate. The target is typically firmly attached to the backing plate. The back surface of the target and the corresponding surface of the backing plate are typically highly polished in the belief that such highly polished surfaces aid in the heat transfer from the target to the backing plate.

Because the material of the target is used up in the sputtering process, sputtering sources are designed and built such that used targets can be removed and new targets mounted. To facilitate removal of the target, the target is typically clamped or bolted to the backing plate. The removal of a spent target and mounting of a new target is referred to as replenishment.

In the sputtering process, approximately 90% of the electrical power supplied is converted to heating of the target. The power densities applied to the target are of such high levels that aggressive cooling of the target is necessary to prevent melting or cracking of the target and to protect the sputtering structures from overheating.

Because of the high energy levels involved in sputtering, and the fact that a large portion of the energy is in the form of heat which must be dissipated, it is highly desirable to increase the heat transference from the target to the backing plate which, in turn, is cooled.

Cooling is commonly achieved by flowing coolant, typically water, against the backing plate. Heat is extracted from the target/backing plate assembly by conduction to the water.

In the past, efforts at cooling targets have been directed to thermal transfer by heat conductivity. To facilitate replenishment, the targets have been affixed to a backing plate, typically by clamps disposed around the periphery of the target plate and the backing plate.

By clamping or bolting the target to the backing plate, thermal conductivity occurs between the mating surfaces of the plates. In this arrangement heat transference occurs from the target to the backing plate. Various arrangements for conductive cooling of the backing plate are discussed in the prior art with a coolant fluid, most commonly water.

A heat transference limitation is that the surface of the target is not in complete contact with the mating surface of the backing plate. Also, sputtering operation occurs in a vacuum; and with no gas molecules to provide in convective transference between the gaps in the surfaces, not only is there limited conductive heat transference, there is no convective heat transfer in these areas.

Thus, there exists a need to enhance target thermal management to improve sputtering efficiency.

SUMMARY OF THE PRESENT INVENTION

A sputter coating apparatus for sputter coating a substrate in a processing chamber is provided that includes a target of sputter coating material supported within the processing chamber. The target has a sputtering surface and a back surface. The target is affixed to a backing plate such that the back surface of the target is disposed adjacent to a first surface of the backing plate. The backing plate is in fluid communication with a source of cooling fluid. The target back surface has a first layer selected to have a predetermined first layer emissivity coefficient. The backing plate first surface carries a second layer having a second layer predetermined emissivity coefficient. In an illustrative embodiment, the predetermined emissivity coefficients of the first and second layers are each of a high value relative to the target sputtering surface. The contact between the first layer of the target back surface and the second layer of the backing plate first surface provides enhanced heat transfer between the target and the backing plate.

The emissivity coefficients of each of the first and second layers in an illustrative embodiment are selected to be greater than 0.1 and preferably greater than 0.7. In an illustrative embodiment of the invention, the first and the second layers are both stainless steel deposited in oxygen plasma.

A target for use in sputtering apparatus comprises a plate of target material. The back surface has a layer thereon. The layer is selected to have a predetermined radiation heat transfer emissivity coefficient. In an embodiment of the invention, the emissivity coefficient is at least 0.1 and preferably is greater than 0.7, which is an emissivity coefficient of 1.0 corresponding to a black body emitter.

A method for providing a target for use in sputtering apparatus comprises selecting a plate of target material and forming a first layer on the back surface of the target. The layer is selected to have a predetermined radiation heat transfer emissivity coefficient. In an embodiment, the emissivity coefficient is at least 0.1 and preferably is greater than 0.7. In a particular embodiment, the layer is formed by sputtering stainless steel in oxygen.

A backing plate for use in sputtering apparatus comprises a surface for upon which a target is affixed. The surface has a second layer thereon. The second layer is selected to have a predetermined radiation heat transfer emissivity coefficient of at least 0.1 and preferably greater than 0.7. In a particular embodiment, the backing plate layer is formed by sputtering stainless steel in oxygen.

A method for providing a backing plate for use in sputtering apparatus includes selecting a plate of a desired material and forming a second layer on a surface of the backing plate that engages a target plate. The second layer is selected to have a predetermined radiation heat transfer emissivity coefficient of at least 0.1 and preferably greater than 0.7. In a particular embodiment, the second layer is formed by sputtering stainless steel in oxygen.

BRIEF DESCRIPTION OF THE DRAWINGS

The invention will be better understood from a reading of the following detailed description of embodiments in conjunction with the drawing figures, in which like reference designators are utilized to identify like elements, and in which.

DETAILED DESCRIPTION OF THE PREFERRED EMBODIMENTS

Figure 1:
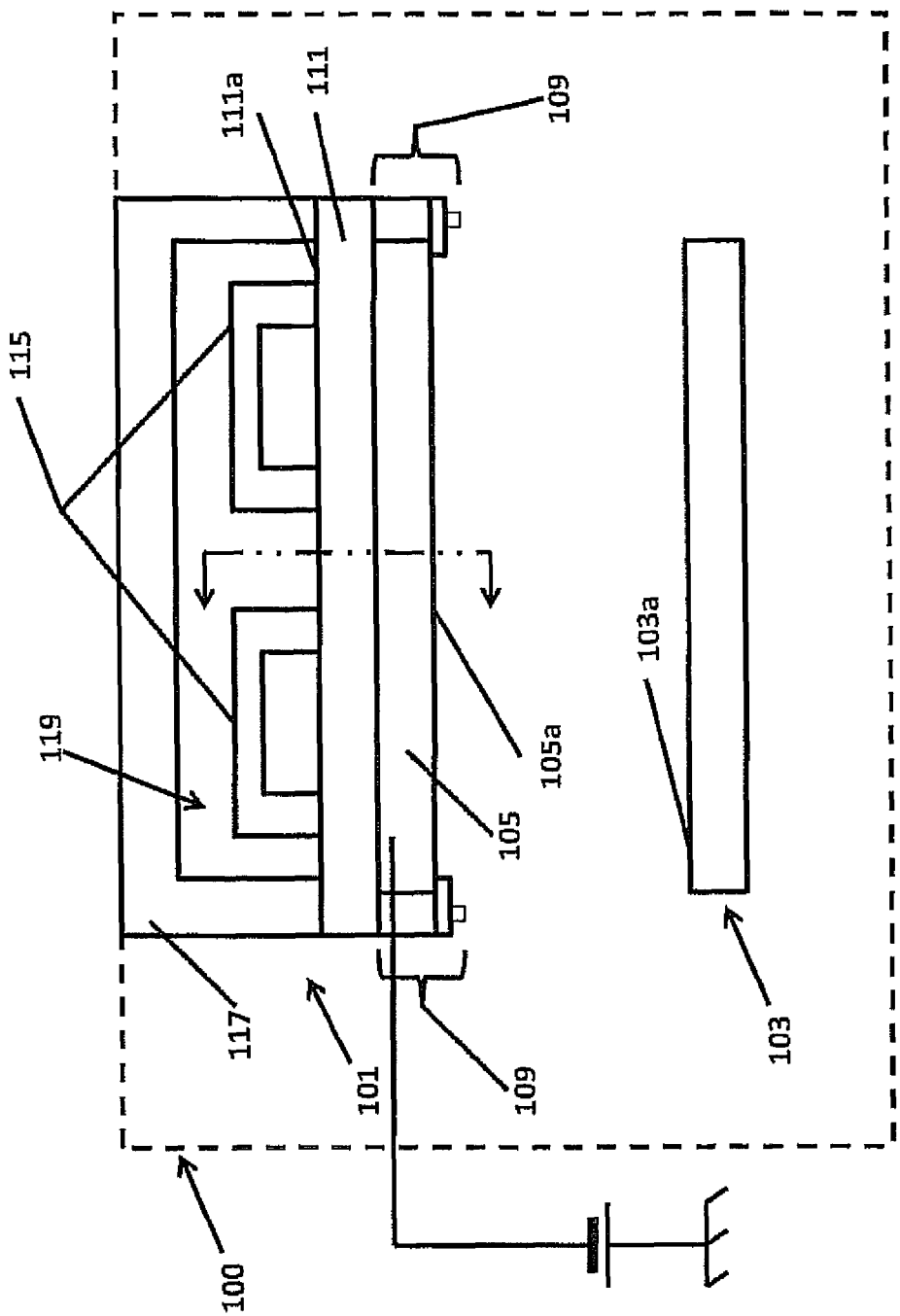
FIG. 1 is a schematic of a sputtering magnetron assembly.

The present invention has utility as a sputtering assembly with improved thermal management characteristics. The prior sputtering assemblies rely upon the fundamental principle that conduction is the most significant means of heat transfer in a solid. Because the target back surface is typically machined and polished and the backing plate mating surface is also machined and polished and the target is clamped or bolted to the backing plate, it is typically assumed that heat transference between the target and the backing plate occurs as a result of conduction or in some instances by conduction where the surface are in direct contact and by convection where the surfaces are separated.

The present invention is based on the surprising discovery that this conventional wisdom is incorrect and instead that the primary conductive transfer between a target and the backing plate occurs through the bolts that clamp the target to the backing plate because there is no assurance that the target is in physical thermal contact with the backing plate throughout the full area and even a microscopic gap between these polished surfaces reduces conduction therebetween. In addition, because the sputtering chamber is evacuated, there is no gas in the gaps between the target and the backing plate to provide convective heat transfer.

Conduction between the target and backing plate is limited, and even at the clamps or bolts, micro-surface roughness results in a maximum of 5% contact area between the surfaces of the target and backing plate. Away from under the clamps or bolts, surface contact between the target and backing plate drops to zero or close to no conductive contact. Due to the poor conductive heat transfer, radiative heat transfer becomes an important heat transference mode, if not the primary mode.

The present invention takes advantage of the fundamental principle that in a vacuum, heat transference between two separated bodies can only occur as a result of radiation, and as such the present invention relies on the discovery that heat transfer between a target and a backing plate is enhanced by providing a layer having a high thermal emissivity coefficient on the back surface of the target and preferably also a layer on the target carrying surface of the backing plate that also has a high thermal emissivity coefficient.

By way of theoretical background, an object at some non-zero temperature radiates electromagnetic energy. In thermodynamics, Kirchhoff's law of thermal radiation, or Kirchhoff's law for short, is a general statement equating emission and absorption in heated objects following from general considerations of thermodynamic equilibrium and detailed balance. Kirchhoff's law states that: At thermal equilibrium, the emissivity of a body or surface equals its absorptivity. Absorptivity (or absorbance) is the fraction of energy that is absorbed by the body or surface. It should be noted that the term "emissivity" as used herein includes "absorptivity".

Heat transfer through radiation takes place in form of electromagnetic waves mainly in the infrared region. Radiation emitted by a body is a consequence of thermal agitation of its composing molecules. Radiation heat transfer can be described by a reference to the so-called "black body".

A black body is defined as a body that absorbs all radiation that falls on its surface. A black body is a hypothetic body that completely absorbs all wavelengths of thermal radiation incident on it. Such bodies do not reflect light, and therefore appear black if their temperatures are low enough so as not to be self-luminous. All black bodies heated to a given temperature emit thermal radiation.

The radiation energy per unit time from a black body is proportional to the fourth power of the absolute temperature and can be expressed with Stefan-Boltzmann Law as $$q = \sigma T^4 A \quad (I)$$

where:
q is the heat transfer per unit time (W);
$\sigma$ is the Stefan-Boltzmann Constant;
T is the absolute temperature Kelvin (K); and
A is the area of the emitting body ($m^2$).

For objects other than ideal black bodies, i.e., "gray bodies", the Stefan-Boltzmann Law can be expressed as $$q = \epsilon \sigma T^4 A \quad (II)$$

where:
$\epsilon$ is the emissivity of the object (1.0 for a black body); and
the other variables have the meanings ascribed thereto in equation (I).

For the Gray Body the Incident Radiation (Also Called Irradiation) is Partly Reflected, absorbed or transmitted.

If a hot object is radiating energy to its cooler surroundings the net radiation heat loss rate can be expressed as $$q = \epsilon \sigma (T_h^4 - T_c^4) A_c \quad (III)$$

where:
$T_h$ is the hot body absolute temperature (K);
$T_c$ is the cold surroundings absolute temperature (K);
$A_c$ is the area of the object ($m^2$); and
the other variables have the meanings ascribed thereto in equation (I)

The emissivity coefficient $\epsilon$ of a material is the ratio of energy radiated by a particular material to energy radiated by a black body at the same temperature. It is a measure of a material's ability to radiate absorbed energy. A true black body would have an emissivity of 1.0, while any real object would have an emissivity less than 1.0. Emissivity is a dimensionless quantity. In general, the duller and blacker a material is, the closer its emissivity is to 1. The more optically reflective a material is, the lower its emissivity. Highly polished copper, such as commonly used for backing plates, has an emissivity coefficient of about 0.023-0.052. In contrast, for example, weathered stainless steel has an emissivity coefficient of 0.85.

Turning now to FIG. 1, a sputtering coating apparatus is shown. The apparatus includes a processing chamber 100 in which the sputtering process is carried out. Various connections to vacuum sources, gas sources and coolant sources are not shown for purposes of clarity. It will be appreciated by those skilled in the art that such connections are well known in the art.

A magnetron sputtering apparatus 101 is disposed within chamber 100. A substrate 103 is also disposed within chamber 101. Substrate 103 includes surface 103a upon which material is to be sputtered.

A target 105 of the material to be sputtered onto surface 103a is affixed to a backing plate 111. The back surface 111a of backing plate 111 is sealed to structure 117 and carries magnets 115. The particular details of the construction of structure 117 and magnets 115 as well as how magnets 115 and structure 117 are of no particular significance to the present invention. Coolant, e.g. water, is flowed through the cavity 119 formed by structure 117 and backing plate 111 to provide cooling during sputtering operations.

Target plate 105 is affixed to backing plate 111 with clamping assemblies 109. Many different arrangements are conventional for affixing target plate 105 to backing plate 111, and the arrangement shown is intended to merely be illustrative of many different ways of affixing target 105 to backing plate 111.

In operation, as material is sputtered off target surface 105a onto substrate surface 103a, target 105 is heated and it is necessary to transfer the heat from target 105 to backing plate 111 to coolant that in cavity 119.

Figure 2:
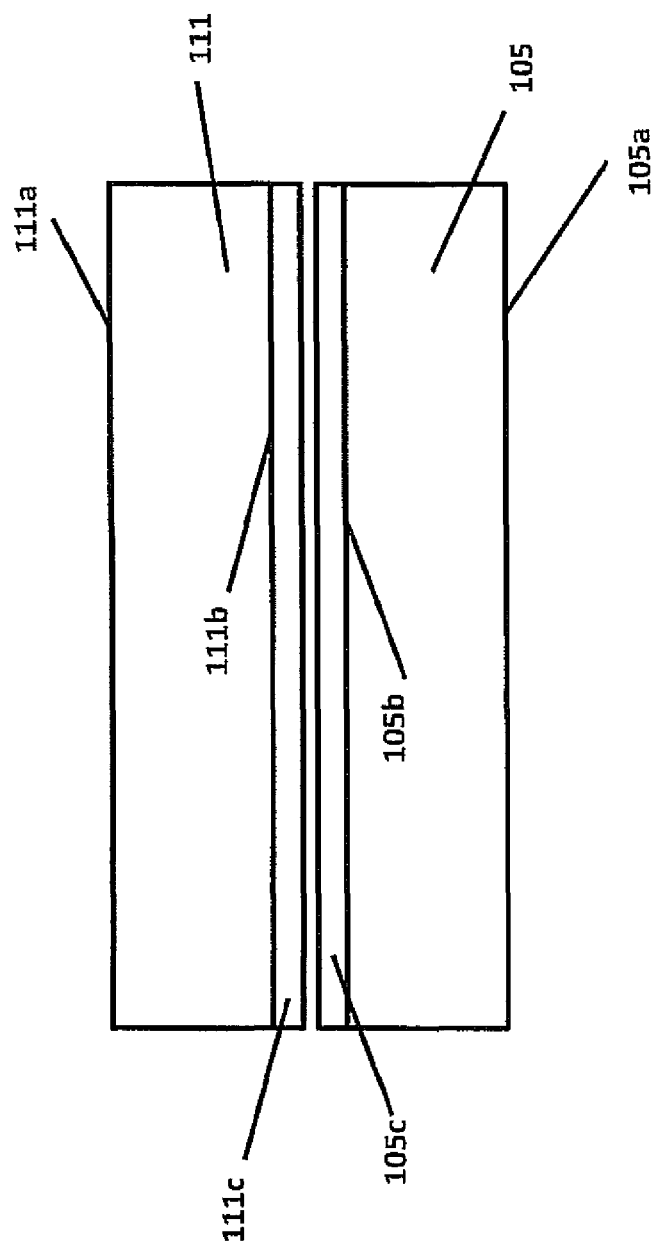
FIG. 2 is a cross-section along the dashed central vertical line of a portion of the sputtering magnetron assembly of FIG. 1 having an inventive construction.

Turning now to FIG. 2, a cross-section is taken through backing plate 111 and target 105. Backing plate 111 is selected to be of a material having sufficient thermal conductivity and carries a layer 111c on its surface 111b that is adjacent to target 105. Layer 111c is selected to have a high emissivity coefficient. A high emissivity coefficient is any emissivity coefficient greater than 0.1 and preferably greater than 0.7. Suitable materials from which layer 111c is formed illustratively include the following along with approximate emissivity coefficients: oxidized steel (0.79), oxidized nickel (0.59-0.86), mild steel (0.2-0.32), oxidized Inconel X (0.71), oxidized copper, oxidized brass (0.6), anodized aluminum (0.77), alloy 24ST (0.9), and flame sprayed alumina (0.8). As noted above weathered stainless steel has an emissivity coefficient of 0.85.

Layer 111c is applied to backing plate 111 by a variety of methods that are known in the art and by way of non-limiting example, may be applied by physical vapor deposition methods such as sputtering, heat treatment, or painting. In one embodiment of the invention, layer 111c is deposited by sputtering stainless steel in oxygen. Emissive layer 111c must be applied to have sufficient thickness such that the radiation energy is absorbed. If emissive layer 111c is too thin, the radiation energy "sees" through the emissive layer to the non-emissive surface and the effective emissivity is reduced.

Since backing plate 111 is selected to have sufficient thermal conductivity, heat absorbed by surface layer 111c is conducted through backing plate 111 to the coolant in cavity 119. For practical purposes such as fabrication concerns or strength concerns, stainless steel may be selected to be the backing plate material. Stainless steel does not have a high thermal conductivity but it can be sufficient. Most of the resistance in the heat path from the sputtered target surface to the cooling water resides at the interface between the bolted/clamped target and the backing plate.

Target 105 is selected to be of the desired sputtering material. Target 105 carries a layer 105c on its surface 105b that is adjacent to backing plate 111. Layer 105c is also selected to have a high emissivity coefficient. A high emissivity coefficient is any emissivity coefficient greater than 0.1 and preferably greater than 0.7. Suitable materials from which layer 105c is formed illustratively include the following along with approximate emissivity coefficients: oxidized steel (0.79), oxidized nickel (0.59-0.86), mild steel (0.2-0.32), oxidized Inconel X (0.71), oxidized copper, oxidized brass (0.6), anodized aluminum (0.77), alloy 24ST (0.9), and flame sprayed alumina (0.8). As noted above weathered stainless steel has an emissivity coefficient of 0.85.

Layer 105c may be applied to surface 105b of target 105 by a variety of methods that are known in the art and by way of non-limiting example, may be applied by a physical vapor deposition such as sputtering, heat treatment, or painting. In one embodiment of the invention, layer 105c is deposited by sputtering stainless steel in oxygen.

Figure 3:
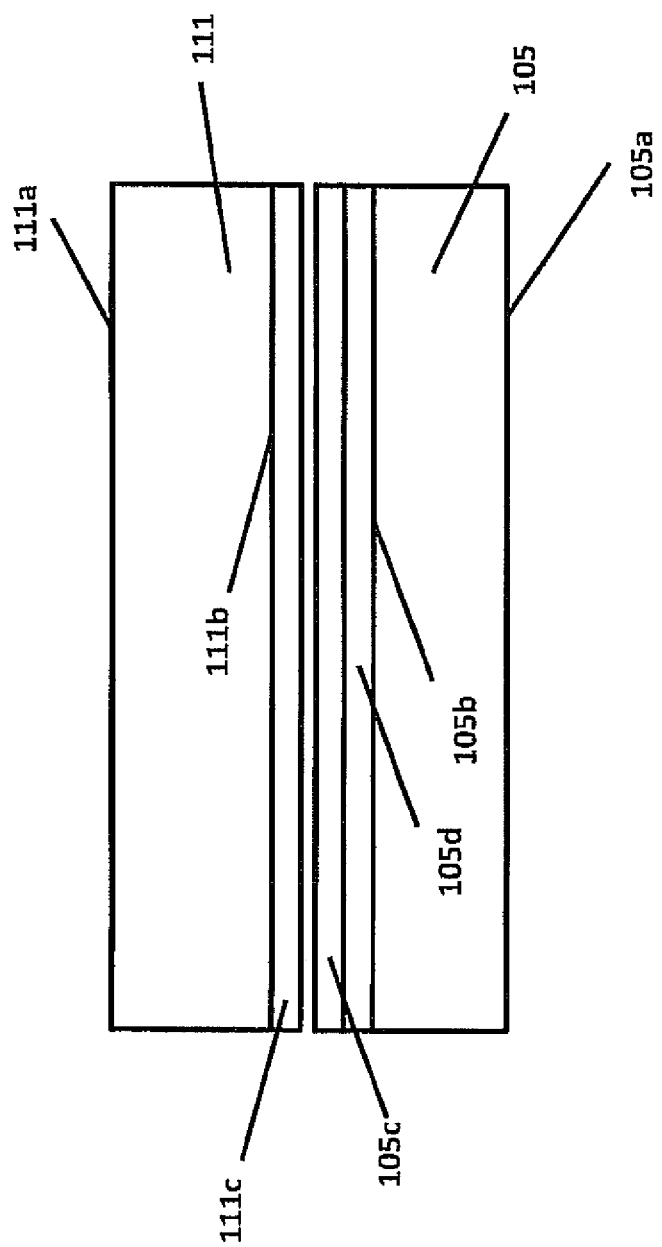
FIG. 3 is a cross-section along the dashed central vertical line of a portion of a sputtering magnetron assembly having a second inventive construction.

In another embodiment shown in FIG. 3, target 105 includes a thermally conductive layer 105d between surface 105b and layer 105c. Thermally conductive layer 105d provides a thermally conductive interface between the target and the emissive layer 105c. In this arrangement, heat is conducted from target 105 to emissive layer 105c by thermally conductive layer 105d. The layer 105d is one of those used for layer 105c that varies in composition relative to layer 105c and serves to enhance adhesion and/or thermal conduction to the backing plate 111.

Figure 4:
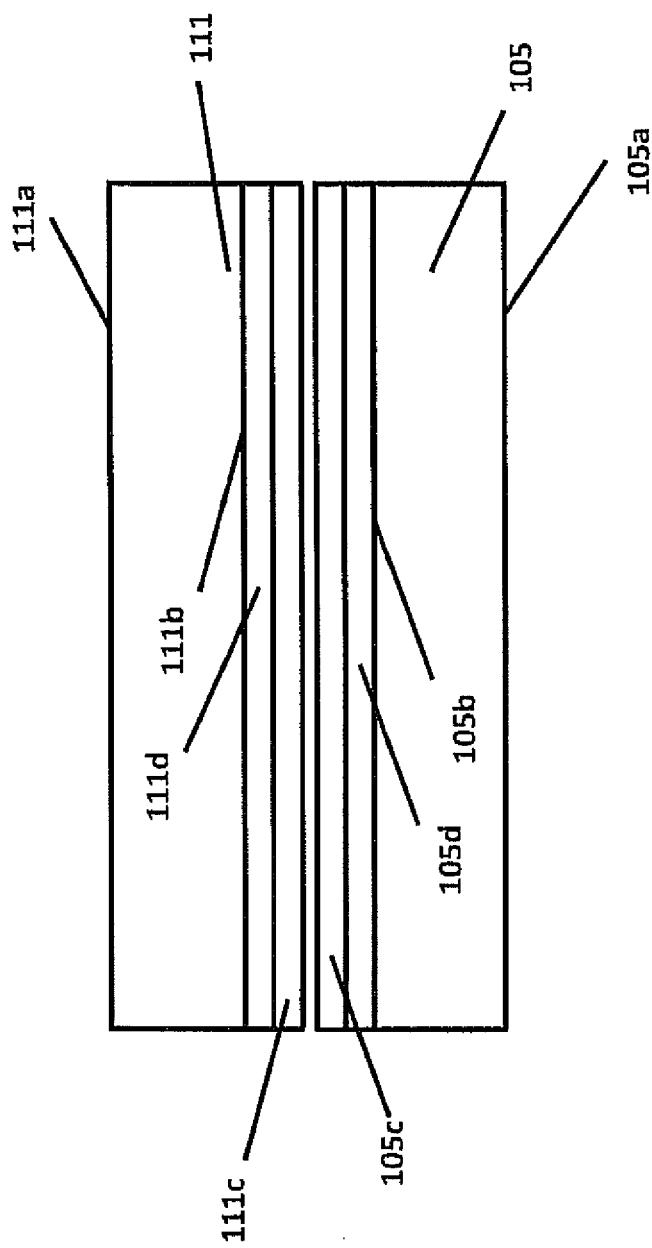
FIG. 4 is a cross-section along the dashed central vertical line of a portion of a sputtering magnetron assembly having a third inventive construction.

In yet a further embodiment, a thermally conductive layer 111d may be disposed between backing plate emissive layer 111c and backing plate surface 111b as shown in FIG. 4. The layer 1115d is one of those used for layer 105c that varies in composition relative to layer 105c and serves to enhance adhesion and/or thermal conduction to the backing plate 111.

Figure 5:
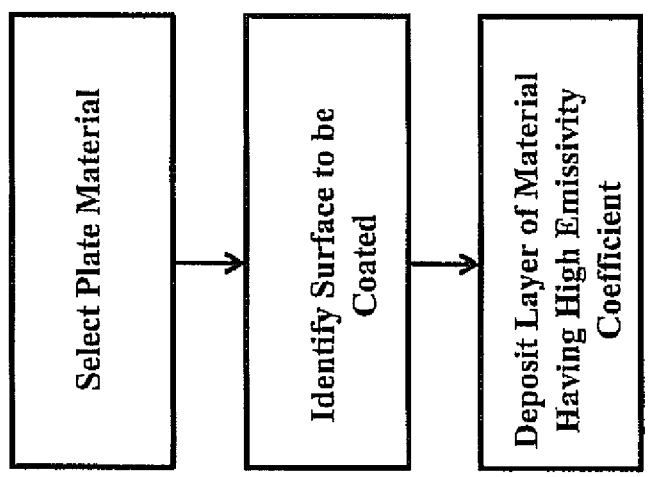
FIG. 5 illustrates steps in the formation of the inventive target plate and backing plate of the sputtering magnetron assembly of FIG. 1.

FIG. 5 summarizes the steps in providing a target and a backing plate of selecting plate material, identifying surface to be coated, and depositing a layer of material having a high emissivity coefficient.

Patent documents and publications mentioned in the specification are indicative of the levels of those skilled in the art to which the invention pertains. These documents and publications are incorporated herein by reference to the same extent as if each individual document or publication was specifically and individually incorporated herein by reference.

The invention has been described in terms of illustrative embodiments. It is not intended that the invention be limited in scope to the embodiments shown and described. It will be apparent to those skilled in the art that various changes and modifications may be made to the embodiments without departing from the scope of the invention. It is intended that the invention be limited only by the scope of the claims appended hereto.

The invention claimed is:

1. A sputter coating apparatus for sputter coating a substrate in a processing chamber, said processing chamber being sealable to provide a vacuum therein, said apparatus comprising:
   a target of sputter coating material supported within said processing chamber, said target having a sputtering surface and a back surface;
   a backing plate coupled to said target with micro-surface roughness resulting in a maximum of 5% contact area between the back surfaces and said backing plate, said backing plate being in fluid communication with a source of cooling fluid, said backing plate having a first surface disposed next to the back surface of said target;

a layer on the first surface of said back plate, said layer having a high emissivity coefficient greater than 0.3 such that radiation heat transfer between said target and said backing plate is improved.

2. The sputter coating apparatus in accordance with claim 1, wherein: said layer is oxidized metal.

3. The sputter coating apparatus in accordance with claim 1, wherein: the high emissivity coefficient is greater than 0.7.

4. The sputter coating apparatus in accordance with claim 1, further comprising: a target back surface layer applied to the back surface of said target, said target back surface layer having an emissivity coefficient greater than 0.3.

5. The sputter coating apparatus in accordance with claim 4, wherein: the emissivity coefficient is greater than 0.7.

6. The sputter coating apparatus in accordance with claim 4, wherein: said layer is formed of one of: oxidized stainless steel, oxidized nickel, mild steel, oxidized Inconel X, oxidized copper, oxidized brass, anodized aluminum, alloy 24ST, or flame sprayed alumina.

* * * * *